United States Patent [19]

Terada et al.

[11] Patent Number: 5,113,149
[45] Date of Patent: May 12, 1992

[54] VARIABLE GAIN AMPLIFIER

[75] Inventors: Norio Terada; Kazuo Tokuda, both of Kanagawa, Japan

[73] Assignee: NEC Corporation, Tokyo, Japan

[21] Appl. No.: 702,628

[22] Filed: May 17, 1991

[30] Foreign Application Priority Data

May 18, 1990 [JP] Japan .................. 2-129832

[51] Int. Cl.$^5$ .................. H03F 3/45; H03F 3/68; H03G 3/30
[52] U.S. Cl. .................. 330/254; 330/295
[58] Field of Search .......... 330/144, 145, 254, 284, 330/295; 358/27, 174

[56] References Cited

U.S. PATENT DOCUMENTS

4,379,995  4/1983  Yamada et al. .................. 330/254

Primary Examiner—James B. Mullins
Attorney, Agent, or Firm—Helfgott & Karas

[57] ABSTRACT

A variable gain amplifier has a first amplifier circuit whose gain is A/n times (A being a real number excepting "0", and n being a real number larger than 1); a second amplifier circuit whose gain is A(n−1/n) times; level converter for level converting an output signal from the second amplifier circuit at a ratio corresponding to a level of a gain control signal having a predetermined level controllable range and at a ratio of 1/(n+1) at a central level within the level controllable range of the gain control signal; and an adder circuit for adding together an output signal from the level converter and an output signal from the first amplifier circuit at the ratio of 1:1. The variable gain amplifier has a gain controllable range of among 1/n ∼ 1 ∼ n times as the level of the gain control signal changes among the minimum level ∼ the central level ∼ the maximum level. When the gain of the second amplifier circuit is set to A(m−1/n) times (m being a real number larger than 1) and a level conversion ratio of the level converter is set to (1−1/n)/(m−1/n) at the central level of the gain control signal, the variable gain amplifer having the gain controllable range of among A/n ∼ A ∼ mA times is realized.

6 Claims, 5 Drawing Sheets

Am: Maximum Gain
A : Central Gain
A/n: Minimum Gain

VARIABLE GAIN AMPLIFIER

BACKGROUND OF THE INVENTION

The present invention relates to a variable gain amplifier and, more particularly, to a variable gain amplifier for use in a video camera system or the like, which is capable of varying a gain in response to levels of a gain control signal.

Figure 1:
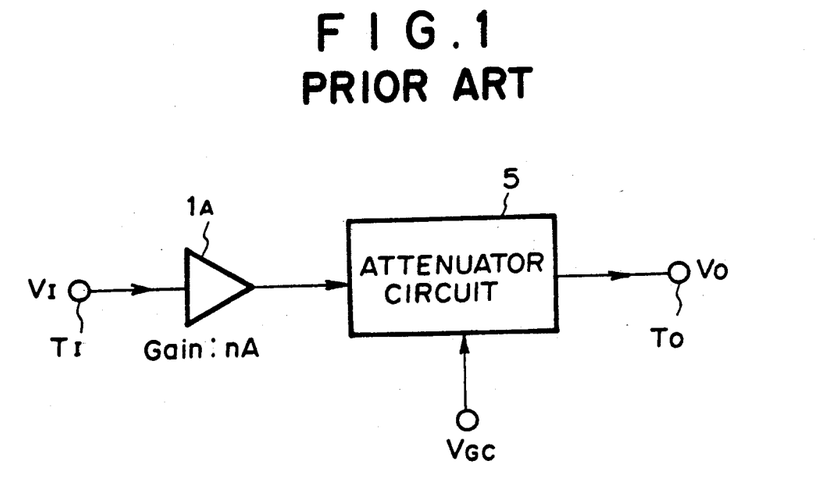
FIG. 1 is a block diagram showing an example of a conventional variable gain amplifier.

Variable gain amplifiers are used in many electronic circuits and, particularly, are used for level controlling of picture signals of a video camera system. As a conventional variable gain amplifier having a gain controllable range of among $1/n$ times ~ 1 time ~ n times, there is a circuit as illustrated in FIG. 1.

An amplifier circuit $1_A$ has a gain of nA times (A being a real number excepting "0", and n being a real number larger than 1: the same hereinafter). An attenuator circuit 5 attenuates an output from the amplifier circuit $1_A$ within a range of from 0 ~ 1 times in response to a gain control signal $V_{GC}$ applied thereto and outputs the attenuated output to an output terminal $T_O$. Further, the attenuator circuit 5 attenuates the output from the amplifier circuit $1_A$ to $1/n$ times at a central value within the controllable range of the gain control signal $V_{GC}$.

Now, it is assumed that an attenuation ratio of the attenuator circuit 5 with respect to an input is set to "1" when a level of the gain control signal $V_{GC}$ is the maximum, is set to $1/n$ at a central voltage value, and is set to "0" at the minimum value. Then, when the level of the gain control signal $V_{GC}$ is the minimum value, a level $v_o$ of an output signal $V_O$ takes the following form, with a level of an input signal $V_I$ being $v_i$:

$$v_o = v_i \times nA \times 0 = 0 \quad (1)$$

When the level of the gain control signal $V_{GC}$ is the central value, the level $v_o$ takes the following form:

$$v_o = v_i \times nA \times 1/n = Av_i \quad (2)$$

When the level of the gain control signal $V_{GC}$ is the maximum value, the level $v_o$ takes the following form:

$$v_o = v_i \times nA \times 1 = nAv_i \quad (3)$$

Figure 2:
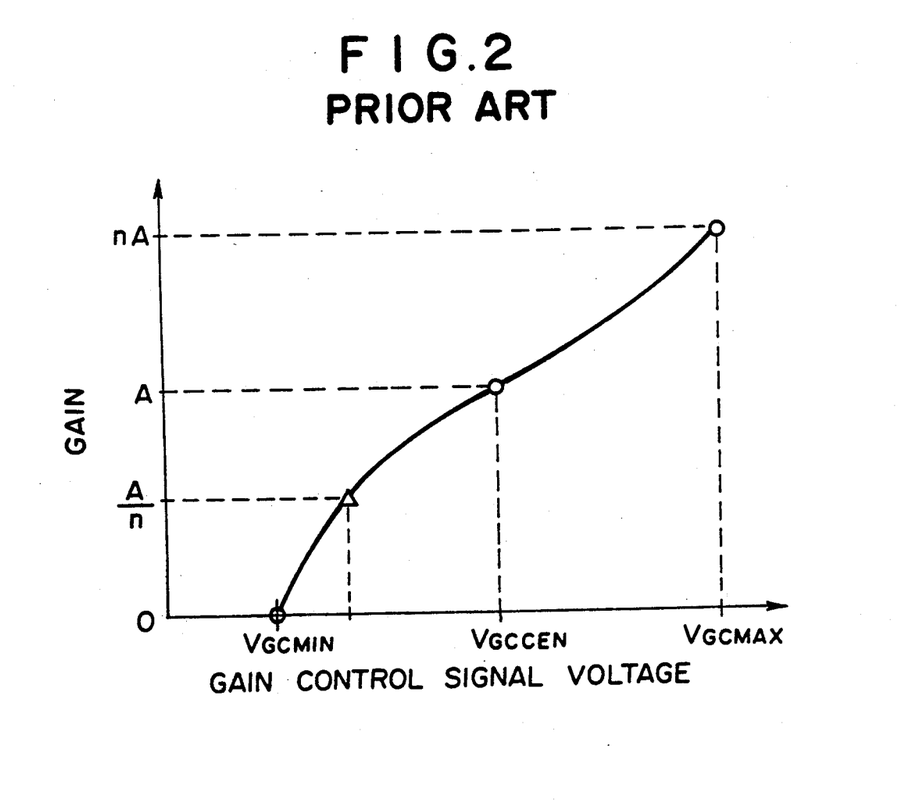
FIG. 2 is a gain-variable characteristic view for explanation of the operation of the amplifier shown in FIG. 1.

A gain variable characteristic in this case is shown in FIG. 2. That is, this variable gain amplifier has a gain controllable range of 0 times ~ A times ~ nA times.

Figure 3:
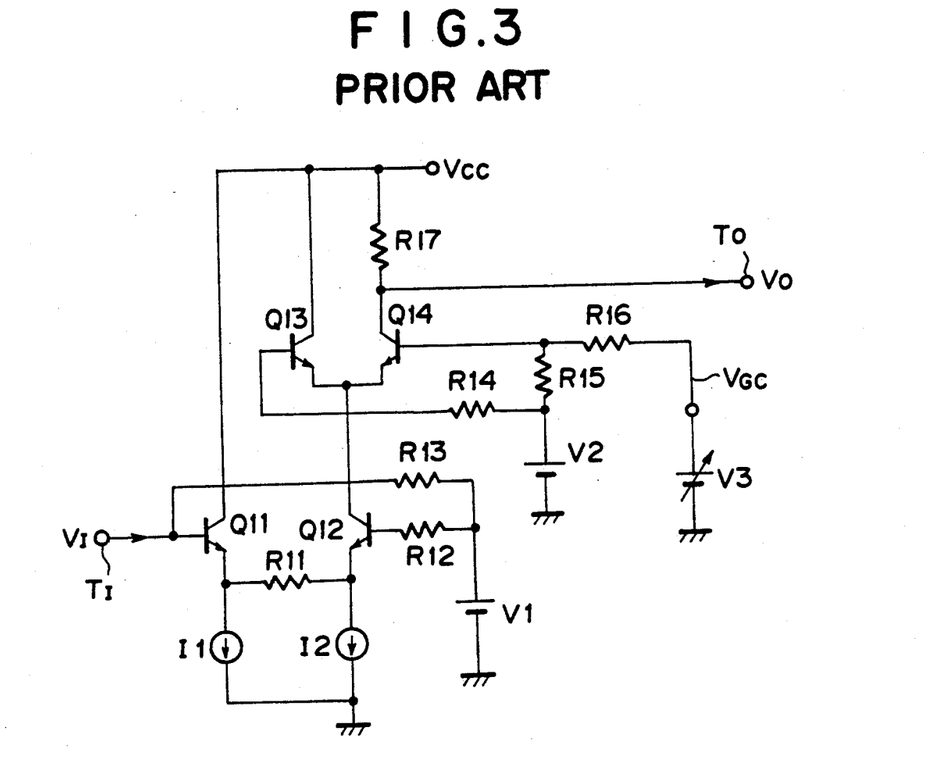
FIG. 3 is a circuit diagram showing specific examples of the respective sections of the embodiment illustrated in FIG. 1.

A specific circuit example of this conventional variable gain amplifier is illustrated in FIG. 3.

In this circuit, transistors Q11 and Q12, constant current sources I1 and I2, and resistors R11 ~ R13 and R17 cooperate with one another to form the amplifier circuit $1_A$ having the gain of nA, and transistors Q13 and Q14 and resistors R14 ~ R17 cooperate with one another to form the attenuator circuit 5 whose attenuation amount varies in response to the level changes in the gain control signal $V_{GC}$. An emitter area ratio between the transistors Q13 and Q14 is set to $(1/1n):(1/n)$.

Here, in order to realize a variable gain amplifier whose gain controllable range is among 0 times ~ 1 time ~ 2 times on the assumption that $A = 1$ and $n = 2$, a resistance ratio between the resistors R11 and R17 should be set to 1:2 and an emitter area ratio between the transistors Q13 and Q14 should be set to 1:1.

Furthermore, as described previously, in order to realize a variable gain amplifier whose gain controllable range is among $A/n$ times ~ A times ~ nA times, the minimum level of the gain control signal $V_{GC}$ should not be "0", but the gain control signal $V_{GC}$ should be such a level that the attenuation amount of the attenuator circuit 5 will be $1/n^2$.

The conventional variable gain amplifier described above has a following disadvantage. That is, the level controlling range of the gain control signal $V_{GC}$ is not of a symmetrical characteristic with respect to the central value ($V_{GCCEN}$) of the gain control signal $V_{GC}$ if an attempt is made on setting the gain controllable range among $A/n$ times ~ A times ~ nA times. This is because such conventional variable gain amplifier is so arranged that the minimum value of the gain becomes "0" when the gain control signal $V_{GC}$ is rendered to the minimum value.

Further, there is another disadvantage. That is, for setting the minimum gain of the gain variable amplifier to $A/n$ times, it requires that the level of the gain control signal $V_{GC}$ be critically set due to such influence as variations in characteristics of the attenuator circuit 5, thereby making it difficult to set the minimum gain.

SUMMARY OF THE INVENTION

It is an object of the invention to overcome the problems existing in the conventional amplifiers and to provide an improved variable gain amplifier.

It is another object of the invention to provide a variable gain amplifier in which, in order to obtain a gain controllable range of $A/n$ times ~ A times ~ nA times, no critical setting is required and gain variable characteristics can easily be made symmetrical with respect to a central value of the level controllable range of the gain control signal.

According to one aspect of the invention, there is provided a variable gain amplifier which comprises:

a first amplifier circuit for amplifying an input signal with a gain of $A/n$ times (A being a real number excepting "0", and n being a real number larger than 1: the same hereinafter);

a second amplifier circuit for amplifying the input signal with a gain of $A(n - 1/n)$ times;

level converting means receiving an output signal from the second amplifier circuit for converting a level of the output signal at a ratio corresponding to a level of a gain control signal having a predetermined level controllable range and at a ratio of $1/(n+1)$ at a level of a central value of the level controllable range of this gain control signal; and an adder means for adding together an output signal from the level converting means and an output signal from the first amplifier circuit at the ratio of 1:1.

Further, the arrangement is such that a level conversion ratio of the level converting means with respect to the output signal from the second amplifier circuit is "0" at the minimum level and is "1" at the maximum level in the level controllable range of the gain control signal.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Next, some preferred embodiments of the invention will be described with reference to the attached drawings.

Throughout the following explanation, similar reference symbols or numerals refer to the same or similar elements in all the figures of the drawings.

Figure 4:
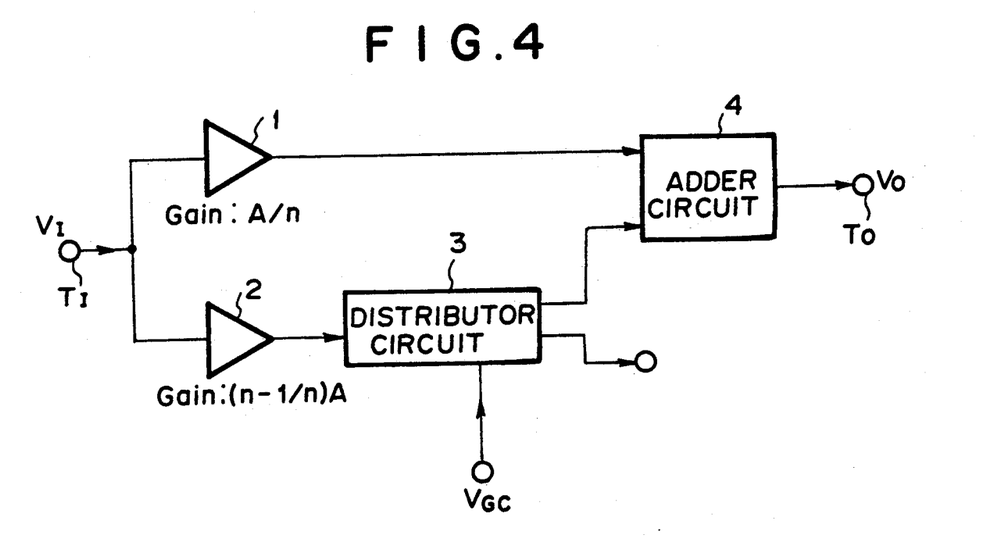
FIG. 4 is a block diagram showing a first embodiment of a variable gain amplifier according to the invention.

FIG. 4 is a block diagram showing a first embodiment of the variable gain amplifier according to the invention.

This embodiment is so arranged that it comprises a first amplifier circuit 1 for amplifying an input signal $V_I$ applied to an input terminal $T_I$ with a gain of A/n times (A being a real number excepting "0", and n being a real number larger than 1: the same hereinafter); a second amplifier circuit 2 for amplifying the input signal $V_I$ with a gain of $A(n-1/n)$ times; a distributor circuit 3, that is, level converting means receiving an output signal from the second amplifier circuit 2 for converting a level of the output signal at a ratio corresponding to a level of a gain control signal $V_{GC}$ having a predetermined level controllable range and at a ratio of $1/(n+1)$ at a level of a central value in the level controllable range of this gain control signal $V_{GC}$, of "0" at a level of the minimum value, and of "1" at a level of the maximum value, thereby outputting the converted level; and an adder circuit 4 for adding together an output signal from this distributor circuit 3 and an output signal from the first amplifier circuit 1 at the ratio of 1:1.

The operation of this embodiment will next be described.

Now, when the level of the gain control signal $V_{GC}$ is the minimum value ($V_{GCMIN}$) within the level controllable range, the level $v_o$ of the output signal $V_O$ appearing at an output terminal $T_O$ is expressed as:

$$v_o = v_i \frac{A}{n} + v_i \times \left(n - \frac{1}{n}\right) A \times 0 = \frac{A}{n} v_i \qquad (4)$$

When the level of the gain control signal $V_{GC}$ is a central value $V_{GCCEN}$ within the level controllable range, the level $v_o$ of the output signal $V_O$ is expressed as:

$$\begin{aligned} v_o &= v_i \times \frac{A}{n} + \left(v_i \times \left(n - \frac{1}{n}\right) A \times \frac{1}{n+1}\right) \\ &= v_i \times \frac{A}{n} + v_i \times \frac{n-1}{n} \times A \\ &= A v_i \end{aligned} \qquad (5)$$

When the level of the gain control signal $V_{GC}$ is in its maximum value $V_{GCMAX}$ within the level controllable range, the level $v_o$ of the output signal $V_O$ is expressed as:

$$v_o = v_i \times \frac{A}{n} + \left(v_i \times \left(n - \frac{1}{n}\right) A \times 1\right) = A n v_i \qquad (6)$$

Figure 5:
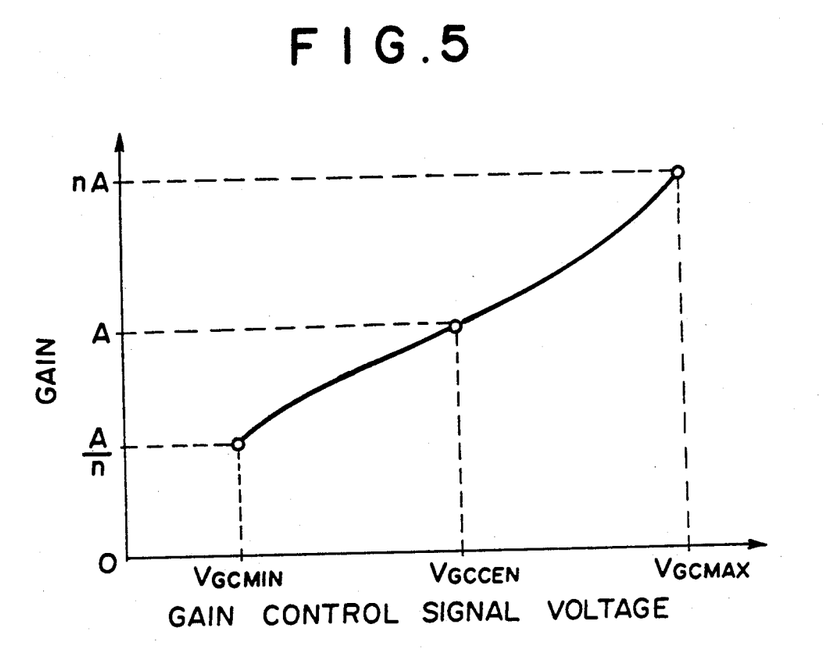
FIG. 5 is a gain-variable characteristic view for explanation of the operation of the amplifier shown in FIG. 4.

Thus, when the levels of the gain control signal $V_{GC}$ are the minimum value, the central value and the maximum value within the level controllable range, the gain of this variable gain amplifier is set to A/n times, A times and nA times. Further, as shown in FIG. 5, the gain characteristic curve of the variable gain amplifier is made symmetrical with respect to the central value $V_{GCCEN}$.

For example, when the variable gain amplifier whose gain is ½ times ~ 1 time ~ 2 times is to be realized under A=1 and n=2, the gain of the amplifier circuit 1 should be set to 0.5, the gain of the amplifier circuit 2 should be set to 1.5, and the ratio of the input level to the output level of the distributor circuit 3 should be set to ⅓ at the central value of the level of the gain control signal $V_{GC}$.

Figure 6:
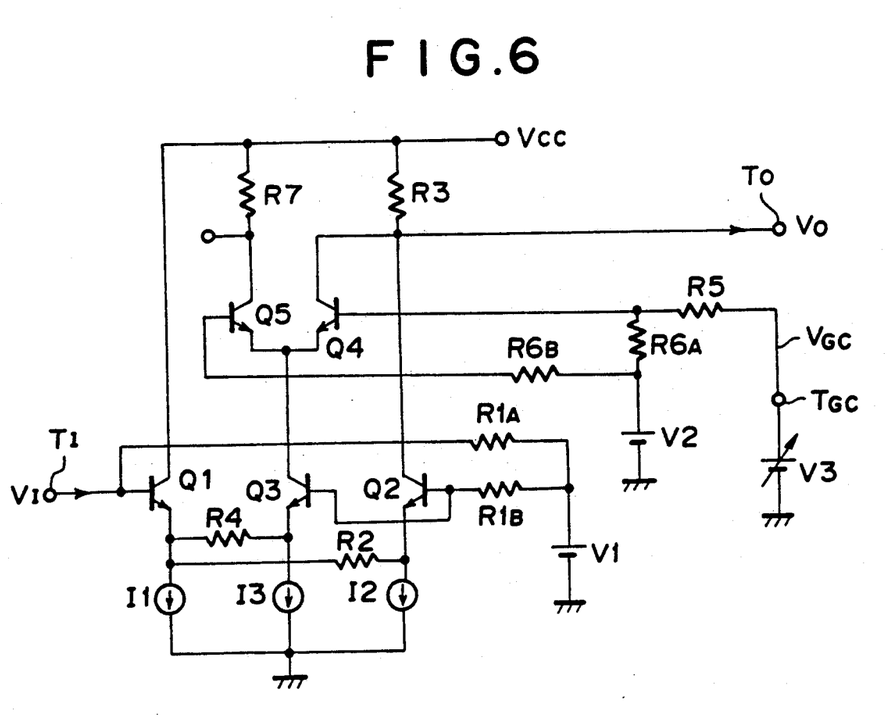
FIG. 6 is a circuit diagram showing specific examples of the respective sections of the embodiment illustrated in FIG. 4.

FIG. 6 is a detailed circuit diagram of this first embodiment, which shows specific examples of the respective sections by use of bipolar transistors.

This circuit is arranged as follows. That is, the first amplifier circuit 1 is so arranged that it includes a first transistor Q1 whose base is connected to the input terminal $T_I$ for the input signal $V_I$ and whose collector is connected to a power-supply terminal for the power-supply voltage $V_{CC}$; first resistors $R1_A$ and $R1_B$ which are connected in series with each other having one end thereof connected to the input terminal $T_I$; a second transistor Q2 whose base is connected to the other end of the first serially connected resistors $R1_A$ and $R1_B$ and whose collector is connected to the output terminal $T_O$; a second resistor R2 connected between emitters of the respective transistors Q1 and Q2; a third resistor R3 whose one end is connected to the collector of the transistor Q2 and whose the other end is connected to the power-supply terminal; and constant current sources I1 and I2 connected respectively between the emitters of the respective transistors Q1 and Q2 and a ground terminal. The second amplifier 2 is so arranged that it includes the transistor Q1; the first resistors $R1_A$ and $R1_B$; the resistor R3; a third transistor Q3 whose base is connected to the other end of the serially connected resistors $R1_A$ and $R1_B$ with the resistor R3 serving as a load resistor through a transistor Q4; a fourth resistor R4 connected between the emitters of the respective transistors Q1 and Q3; and a constant current source I3 connected between the emitter of the transistor Q3 and the ground terminal. The distributor circuit 3 is formed by a circuit including the resistor R3; a fifth resistor R5 whose one end is connected to an input terminal $T_{GC}$ for the gain control signal $V_{GC}$; the fourth transistor Q4 whose base is connected to the other end of this resistor R5, whose collector is connected to one end of the resistor R3 and whose emitter is connected to the collector of the transistor Q3; sixth resistors $R6_A$ and $R6_B$ which are connected in series with each other having one end thereof connected to the other end of the resistor R5; a fifth transistor Q5 whose base is connected to the other end of the serially connected resistors $R6_A$ and $R6_B$ and whose emitter is connected to the emitter of the transistor Q4; and a seventh resistor R7 connected between a collector of this transistor Q5 and the power-supply terminal, a signal from the collector of the transistor Q3 being distributed to the collectors of the respective transistors Q4 and Q5 at the ratio of $1/(n+1):n/(n+1)$. The adder circuit 4 is formed by the resistor R3.

In connection with the above, an emitter area ratio between the transistors Q4 and Q5 is set to $1/(n+1): n/(n+1)$.

Here, in order to realize a variable gain amplifier whose gain controllable range is of among ½ times ~ 1 time ~ 2 times similarly to the foregoing, a resistance ratio between the resistor R2 and the resistor R3 should be set to 1:2, a resistance ratio between the resistor R4 and the resistor R3 should be set to 2:3, and the emitter area ratio between the transistors Q4 and Q5 should be set to 1:2.

As described above, the present invention is so arranged as to be provided with the first and second amplifier circuits for amplifying their respective input signals by $A/n$ times and $A(n-1/n)$ times, respectively, and the level converting means for multiplying the output signal from the second amplifier circuit by $1/(n+1)$ times at the central value in the level controllable range at the level of the gain control signal, the output signal from the first amplifier circuit and the output signal from the level converting means being added to each other at the ratio of 1:1. Thus, there can be achieved the following advantages. That is, no critical setting is required in order to obtain the gain controllable range of $A/n$ times ~ $A$ times ~ $nA$ times, and the gain controllable characteristic can easily be made symmetrical with respect to the central value in the level controllable range at the level of the gain control signal.

Hereunder, a variable gain amplifier of a second embodiment according to the invention will be explained by making reference to FIG. 7 through FIG. 9. The reference symbols used in the first embodiments are used for the same or like elements in this second embodiment.

Figure 7:
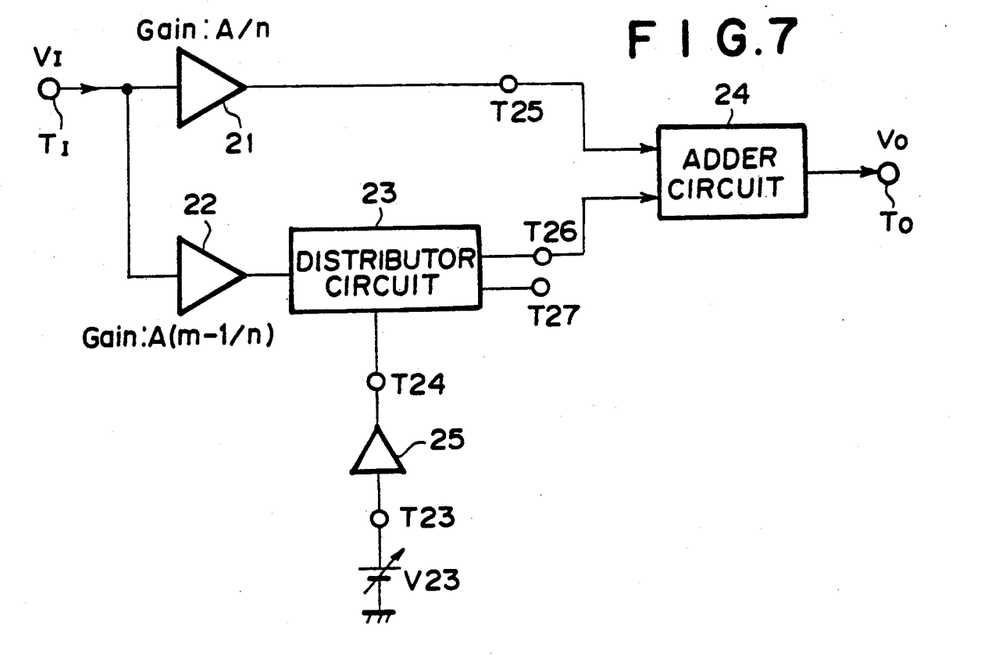
FIG. 7 is a block diagram showing a second embodiment of a variable gain amplifier according to the invention.

FIG. 7 is a block diagram of the variable gain amplifier of the second embodiment wherein the minimum gain is $A/n$ times, the central gain is $A$ times and the maximum gain is $A \cdot m$ times. A first amplifier circuit 21 and a second amplifier circuit 22 have a gain of $A/n$ times and a gain of $A(m-1/n)$ times, respectively, with respect to an input signal $V_I$ applied to a common input terminal $T_I$ (A being a real number excepting "0", and each of m and n being a real number larger than 1: the same hereinafter). A distributor circuit 23 is so designed that it converts the level of an input signal inputted thereto into the level of 0 times, $(1 - 1/n)/(m - 1/n)$ times and 1 time at the side of its output terminal T26 when the respective voltage levels of the gain control signal source V23 are the minimum value $V_{GCMIN}$, the central value $V_{GCCEN}$ and the maximum value $V_{GCMAX}$. An adder circuit 24 adds together an output signal from the first amplifier circuit 21 and an output signal from the distributor circuit 23 at the ratio 1:1 and outputs the output signal $V_O$ at the output terminal $T_O$.

When the voltage level of the gain control signal source V23 takes the minimum value $V_{GCMIN}$, that is, the distribution passing ratio of the distributor circuit 23 at the side of an output terminal T26 is 0 times, the level $v_o$ of the output signal $V_o$ appearing at the output terminal $T_0$ is expressed as:

$$v_o = v_i \times A/n + v_i \times A(m - 1/n) \times 0 \quad (7)$$
$$= v_i \times A/n$$

When the voltage level of the gain control signal source V23 takes the central value $V_{GCCEN}$, that is, the distribution passing ratio of the distributor circuit 23 is $(1 - 1/n)/(m - 1/n)$ times, the output signal level $v_o$ is expressed as:

$$v_o = v_i \times A/n + v_i \times A(m - 1/n) \times (1 - 1/n)/(m - 1/n) \quad (8)$$
$$= v_i \times A/n + v_i \times A(1 - 1/n)$$
$$= v_i \times A$$

When the voltage level of the gain control signal source V23 takes the maximum value $V_{GCMAX}$, that is, the distribution passing ratio of the distributor circuit 23 is 1 time, the output signal level $v_o$ is expressed as:

$$v_o = v_i \times A/n + v_i \times A(m - 1/n) \times 1 \quad (9)$$
$$= v_i \times Am$$

Figure 9:
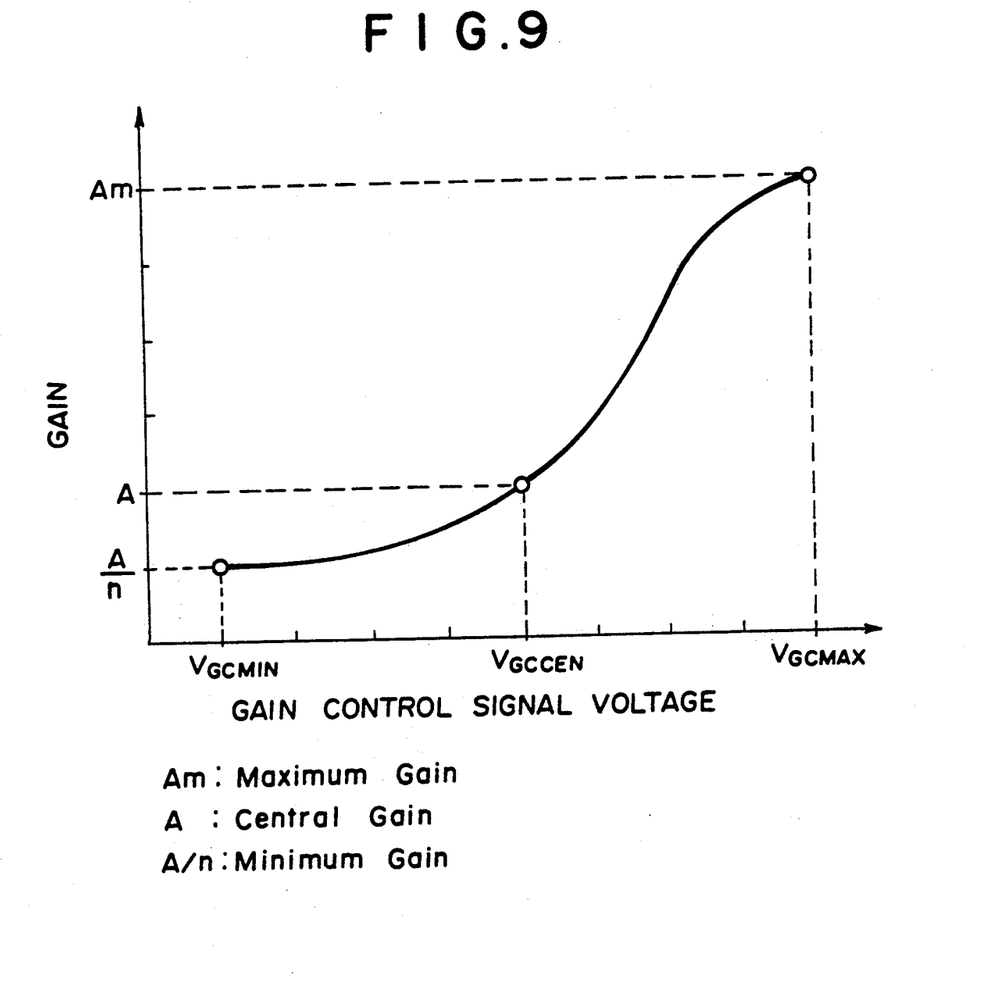
FIG. 9 is a gain-variable characteristic view for explanation of the operation of the amplifier shown in FIG. 7.

As a result of the above equations (7) through (9), the gain-variable characteristic obtained from the variable gain amplifier of this embodiment can be illustrated as shown in FIG. 9. FIG. 9 shows that the variable gain amplifier of this embodiment is realized to have a gain controllable range of $A/n$ times ~ $A$ times ~ $A \cdot m$ times when the voltage level of the gain control signal source V23 is set to the minimum value $V_{GCMIN}$ ~ the central value $V_{GCCEN}$ ~ the maximum value $V_{GCMAX}$, and that both the gain differences of the minimum gain of $A/n$ times and the maximum gain of $A \cdot m$ times with respect to the central gain $A$ times correspond to the same controlling width or range of the gain control voltage.

Figure 8:
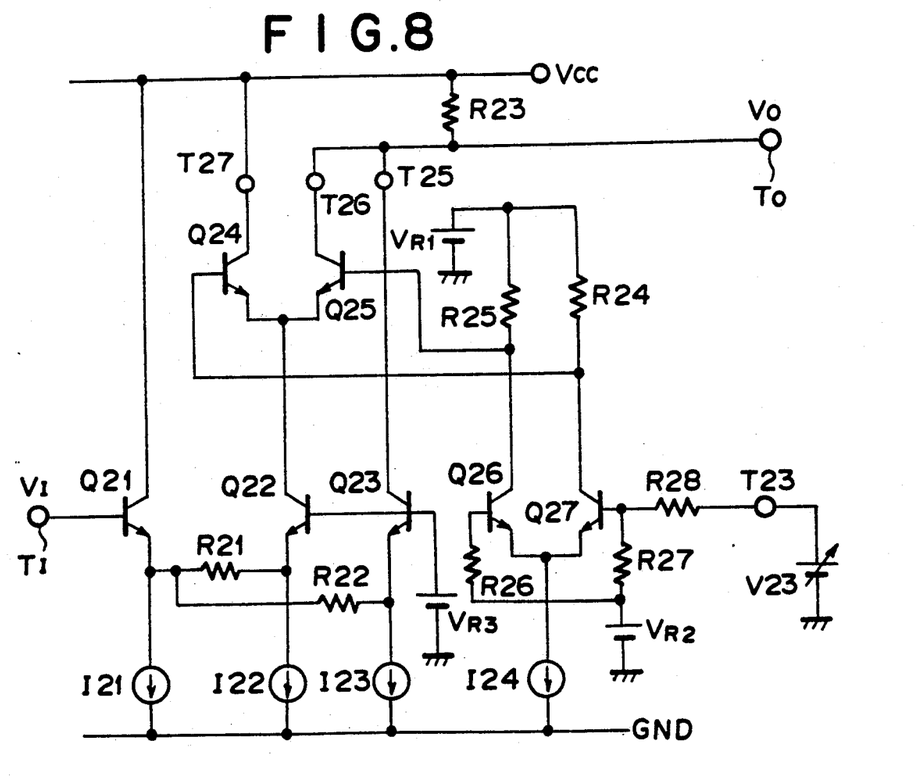
FIG. 8 is a circuit diagram showing specific examples of the respective sections of the embodiment illustrated in FIG. 7.

FIG. 8 is a detailed circuit diagram of the variable gain amplifier of this second embodiment. The first amplifier circuit 21 having a voltage gain of $A/n$ times is formed by transistors Q23, Q21 and resistors R22, R23. The second amplifier circuit 22 having a voltage gain of $(m - 1/n)A$ times is formed by the transistors Q22, Q21 and resistors R21, R23. The distributor circuit 23 is formed by a pair of differentially connected transistors Q24 and Q25 having their common emitters served as an input node. Here, the emitter area ratio between the transistors Q24 and Q25 is set to $(m-1)/(m-1/n):(1-1/n) (m-1/n)$, so that the signal distribution passing ratio of $(1-1/n)/(m-1/n)$ times is realized at the collector of the transistor Q25 when the differential circuit formed by the transistors Q24, Q25 is in its balanced state. The resistor R23 serves also as the adder circuit 24.

In the detailed circuit diagram shown in FIG. 8, when the variable gain amplifier whose voltage gain is controllable among ½ times ~ 1 time ~ 3 times is to be realized, A, n and m are A=1, n=2 and m=3, respectively. Satisfying the resistance ratios among the resistors R21, R22, R23, and the emitter area ratio between the transistors Q24 and Q25 the following relations, that is, R23:R22=0.5:1
R23:R21=2.5:1, and
Q24:Q25=4:1, the first amplifier circuit 21 having a gain of ½, the second amplifier circuit 22 having a gain of 2.5, and the distributor circuit 23 having a distribution passing ratio of 1/5 at the central value within the controllable range can be realized, respectively.

For example, when the gain control signal source V23 takes in its minimum voltage $V_{GCMIN}$, as the base potentials of the transistors Q24 and Q25 are of the highest value and the lowest value, respectively, the transistor Q25 turns OFF so that there is outputted to the output terminal $T_O$ a signal only from the first amplifier circuit 21 formed by the resistor R22, the transistor Q23 and the resistor R23. That is, the variable gain amplifier is set to have a voltage gain of ½ times.

When the gain control signal source V23 takes in its maximum voltage $V_{GCMAX}$, as the base potentials of the transistors Q24 and Q25 are of the lowest value and the highest value, respectively, only the transistor Q25 between them turns ON so that a signal from the second amplifier circuit 22 having a voltage gain of 2.5 times and formed by the resistor R21, the transistor Q22 and the resistor R23 is fully outputted to the terminal T26. As a consequence, at the output terminal $T_O$ of the amplifier, there is obtained an output signal having the gain of 3 times which is a result of the addition of the output signal from the first amplifier circuit 21 having the gain of 0.5 times and the output signal form the second amplifier circuit 22 having the gain of 2.5 times.

When the gain control signal source V23 is in its central voltage $V_{GCCEN}$, as the base potentials of the transistors Q24 and Q25 equal to each other, both the transistors Q24 and Q25 turn ON and each transistor has a signal distribution passing ratio according to the emitter area ratio between both the transistors, that is, 4:1, the signal output of the second amplifier circuit 22 having the gain of 2.5 times and formed by the resistor R21, the transistor Q23 and the resistor R23 is multiplied by 0.5 times and then outputted to the terminal T26 as a signal corresponding to 0.5 times. As a consequence, there is obtained at the output terminal $T_O$ an output signal having the voltage gain of 1 time which is a result of the addition of the signal appearing at the terminal T26 and the signal from the first amplifier circuit 21 having the gain of 0.5 times and formed by the resistor R22, the transistor Q23 and the resistor R23.

Accordingly, by setting the voltage of the gain control signal source V23 to the minimum value ~ the central value ~ the maximum value, the variable gain amplifier whose voltage gain is controllable within ½ times ~ 1 time ~ 3 times can be realized.

As described above, the variable gain amplifier according to the present invention has an advantage in that it is easy to obtain the respective desired voltage gains, that is, the minimum gain of A/n times, the central gain of A times and the maximum gain of A·m times, by setting the voltage value of the gain control signal source to the lowest value, the central value and the highest value, respectively. Further, the amplifier of the invention has another advantage in that as the voltage value of the gain control voltage corresponding to the central gain of A times resides at the center point within the voltage controllable range, the respective voltage control ranges toward the side of the minimum gain and toward the side of the maximum gain with respect to the central value are the same and therefore the dynamic range of the gain control signal becomes good balanced with respect to the central gain.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A variable gain amplifier comprising:
   a first amplifier circuit for amplifying an input signal with a gain of A/n times (A being a real number excepting "0", and n being a real number larger than 1: the same hereinafter);
   a second amplifier circuit for amplifiying said input signal with a gain of A(n−1/n) times;
   level converting means receiving an output signal from said second amplifier circuit for converting a level of said output signal at a ratio corresponding to a level of a gain control signal having a predetermined level controllable range and at a ratio of 1/(+1) at a level of a central value of the level controllable range of this gain control signal; and
   an adder circuit for adding together an output signal from said level converting means and an output signal from said first amplifier circuit at the ratio of 1:1.

2. A variable gain amplifier according to claim 1, wherein a level conversion ratio of the level converting means with respect to the output signal from said second amplifier circuit is "0" at the minimum-value level and is "1" at the maximum-value level in the level controllable range of the gain control signal.

3. A variable gain amplifier according to claim 1, wherein said first amplifier circuit includes a first transistor whose base is connected to an input terminal for an input signal and whose collector is connected to a power-supply terminal; a first resistor whose one end is connected to said input terminal; a second transistor whose base is connected to the other end of the first resistor and whose collector is connected to an output terminal; a second resistor connected between emitters of said respective first and second transistors; and a third resistor whose one end is connected to the collector of said second transistor and whose the other end is connected to said power-supply terminal,
   wherein said second amplifier includes said first transistor; said first resistor; said third resistor; a third transistor whose base is connected to the other end of said first resistor with said third resistor serving as a load resistor; and a fourth resistor connected between emitters of said respective first and third transistors,
   wherein said level converting means has a distributor circuit including said third resistor; a fifth resistor whose one end is connected to an input terminal for the gain control signal; a fourth transistor whose base is connected to the other end of the fifth resistor, whose collector is connected to one end of said third resistor and whose emitter is connected to the collector of said third transistor; a sixth resistor whose one end is connected to the other end of said fifth resistor; a fifth transistor whose base is connected to the other end of this sixth resistor and whose emitter is connected to the emitter of said fourth transistor; and a seventh resistor connected between the collector of this fifth transistor and the power-supply terminal, said distributor circuit being such that a signal from the collector of said third transistor is distributed to the collectors of the respective fourth and fifth transistors with a ratio of $1/(n+1):n/(n+1)$, and wherein said adder circuit is formed by said third resistor.

4. A variable gain amplifier according to claim 3, wherein an emitter area ratio between said fourth and fifth transistor is set to $1/(n+1):n/(n+1)$.

5. A variable gain amplifier comprising:
a first amplifier circuit for amplifying an input signal with a gain of $A/n$ times (A being a real number excepting "0", and n being a real number larger than 1: the same hereinafter);
a second amplifier circuit for amplifying said input signal with a gain of $A(m-1/n)$ times (m being a real number larger than 1: the same hereinafter);
level converting means receiving an output signal from said second amplifier circuit for converting a level of said output signal at a ratio corresponding to a level of a gain control signal having a predetermined level controllable range and at a ratio of $(1-1/n)/(m-1/n)$ at a level of a central value of the level controllable range of this gain control signal; and
an adder circuit for adding together an output signal from said level converting means and an output signal from said first amplifier circuit at the ratio of 1:1.

6. A variable gain amplifier according to claim 5, wherein said level converting means includes a first and second transistors which are differentially connected with each other and which have a emitter area ratio therebetween of $(m-1)/(m-1/n):(1-1/n)/(m-1/n)$.

* * * * *